United States Patent
Lu et al.

(10) Patent No.: US 10,923,062 B2
(45) Date of Patent: Feb. 16, 2021

(54) DISPLAY PANEL, MANUFACTURING METHOD THEREOF, DRIVING METHOD AND DISPLAY DEVICE

(71) Applicants: Chongqing BOE Optoelectronics Technology Co., Ltd., Chongqing (CN); BOE TECHNOLOGY GROUP CO., LTD., Beijing (CN)

(72) Inventors: Junhong Lu, Beijing (CN); Bo Xu, Beijing (CN); Shuai Hou, Beijing (CN); Xinxin Wu, Beijing (CN); Xiang Fang, Beijing (CN); Tonghui Li, Beijing (CN); Zheng Wang, Beijing (CN); Zhengkun Shao, Beijing (CN)

(73) Assignees: Chongqing BOE Optoelectronics Technology Co., Ltd., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/398,662

(22) Filed: Apr. 30, 2019

(65) Prior Publication Data

US 2020/0074951 A1 Mar. 5, 2020

(30) Foreign Application Priority Data

Aug. 29, 2018 (CN) .......................... 2018 1 0997011

(51) Int. Cl.
*G09G 3/36* (2006.01)
*H01L 27/32* (2006.01)
(Continued)

(52) U.S. Cl.
CPC .......... *G09G 3/3677* (2013.01); *G02F 1/1365* (2013.01); *G02F 1/1368* (2013.01);
(Continued)

(58) Field of Classification Search
CPC .......... G09G 3/3677; G09G 2300/023; G09G 2300/0426; G09G 3/3674; G09G 3/3266;
(Continued)

(56) References Cited

U.S. PATENT DOCUMENTS 7,755,565 B2 * 7/2010 Park ...................... G09G 3/3611
345/1.1
8,947,325 B2 * 2/2015 Anzai ...................... G06F 1/32
345/76
(Continued)

FOREIGN PATENT DOCUMENTS

| CN | 201017610 | 2/2008 |
|----|-----------|--------|
| CN | 101645246 | 2/2010 |

(Continued)

OTHER PUBLICATIONS

1st Office Action dated Jun. 9, 2020 for Chinese Patent Application No. 201810997011.X.

*Primary Examiner* — Bryan Earles

(74) *Attorney, Agent, or Firm* — Thomas | Horstemeyer LLP

(57) ABSTRACT

A display panel includes a first display sub-panel and a second display sub-panel disposed opposite to each other, the first display sub-panel including a plurality of first gate lines and the second display sub-panel including a plurality of second gate lines. The display panel further includes a plurality of single-way conducting switches, the first gate lines, the second gate lines and the single-way conducting switches being disposed in one-to-one correspondence, each of the single-way conducting switches having an input end which is electrically connected to the corresponding first gate line and an output end which is electrically connected to the corresponding second gate line, and each of the single-way conducting switches being unidirectionaly con- (Continued)

ducted from the corresponding first gate line to the corresponding second gate line.

20 Claims, 7 Drawing Sheets

(51) Int. Cl.
*G02F 1/1368* (2006.01)
*G02F 1/1365* (2006.01)
*G02F 1/1345* (2006.01)
*G02F 1/1362* (2006.01)
*G02F 1/1333* (2006.01)
*H01L 27/12* (2006.01)

(52) U.S. Cl.
CPC .... *G02F 1/13454* (2013.01); *G02F 1/136286* (2013.01); *H01L 27/3262* (2013.01); *H01L 27/3267* (2013.01); *H01L 27/3276* (2013.01); G02F 2001/133342 (2013.01); G09G 2300/023 (2013.01); *H01L 27/1251* (2013.01); *H01L 27/1255* (2013.01)

(58) Field of Classification Search
CPC .... G09G 3/3648; G09G 5/12; G02F 1/13454; G02F 1/136286; G02F 1/1365; G02F 1/1368; G02F 2001/133342; H01L 27/3262; H01L 27/3267; H01L 27/3276; H01L 27/1251; H01L 27/1255; H01L 27/1214
See application file for complete search history.

(56) References Cited

U.S. PATENT DOCUMENTS

| | | | |
|---|---|---|---|
| 9,129,575 B2* | 9/2015 | Ohara | G09G 3/3677 |
| 9,478,595 B2* | 10/2016 | Xu | H01L 29/423 |
| 9,626,028 B2* | 4/2017 | Li | G06F 3/0412 |
| 10,210,812 B2* | 2/2019 | Kim | G09G 3/3266 |
| 2008/0172569 A1 | 7/2008 | Lee | |
| 2016/0300895 A1* | 10/2016 | Jun | H01L 27/124 |

FOREIGN PATENT DOCUMENTS

| | | |
|---|---|---|
| CN | 201594377 | 9/2010 |
| CN | 202363090 | 8/2012 |
| CN | 103886813 | 6/2014 |
| CN | 103971651 | 8/2014 |
| CN | 107621708 | 1/2018 |

* cited by examiner

DISPLAY PANEL, MANUFACTURING METHOD THEREOF, DRIVING METHOD AND DISPLAY DEVICE

CROSS-REFERENCE TO RELATED APPLICATIONS

The present application claims the benefit of and priority to Chinese Patent Application No. 201810997011.X filed Aug. 29, 2018, the entire contents of which being incorporated herein by reference.

TECHNICAL FIELD

The present disclosure relates to the field of display technologies, and more particularly, to a display panel, a manufacturing method thereof, a driving method, and a display device.

BACKGROUND

A double-sided display device is a display device that includes a double-sided display. Presently, double-sided display devices have a very vast market foreground and these devices are mainly applied to road sign boards, communication tools (such as mobile phones), and window interaction tools (such as government windows, financial enterprise windows). A common double-sided display device is formed by bonding two display panels arranged opposite to one another, which has a relatively complicated driving process. When the synchronous display of the two display panels is performed, the asynchronous display of two screens commonly occurs and, as such, there is a problem of poor display synchronization.

SUMMARY

An embodiment of the present disclosure provides a display panel, comprising: a first display sub-panel and a second display sub-panel disposed opposite to each other, the first display sub-panel comprising a plurality of first gate lines and the second display sub-panel comprising a plurality of second gate lines, wherein the display panel further comprises a plurality of single-way conducting switches, the first gate lines, the second gate lines and the single-way conducting switches being disposed in one-to-one correspondence, each of the single-way conducting switches having an input end which is electrically connected to the corresponding first gate line and an output end which is electrically connected to the corresponding second gate line, and each of the single-way conducting switches being unidirectionaly conducted from the corresponding first gate line to the corresponding second gate line.

The display panel provided by the present disclosure disposes the single-way conducting switch which is connected between each of the first gate lines and the second gate line corresponding thereto. When the double-sided synchronous display of the display panel is required, a gate scan signal is sent to the first gate line of the display sub-panel, but no signal or a cutoff signal is inputted to the second gate line of the second display sub-panel. The single-way conducting switch, at this time, is turned on and the second gate line corresponding to the first gate line is also synchronously inputted with the gate scan signal by the connection to the single-way conducting switch.

An embodiment of the present disclosure further provides a method for manufacturing a display panel, comprising: providing a base substrate having a first surface and a second surface, which is opposite to the first surface; forming a first stacked structure on the first surface; forming a second stacked structure on the second surface; wherein a structure consisted of the first stacked structure, the base substrate and the second stacked structure comprises a first display sub-panel and a second display sub-panel disposed opposite to each other and a plurality of single-way conducting switches; wherein, the first display sub-panel comprises a plurality of first gate lines and the second display sub-panel comprises a plurality of second gate lines, the first gate lines, the second gate lines and the single-way conducting switches are provided in one-to-one correspondence, each of the single-way conducting switches comprises an input end which is electrically connected to the corresponding first gate line and an output end which is electrically connected to the corresponding second gate line; each of the single-way conducting switches is unidirectionally conducted from the first gate line to the second gate line corresponding thereto.

An embodiment of the present disclosure further provides a driving method for a display panel being used for driving the display panel provided in the first aspect, comprising: when the simultaneous display of the first display sub-panel and the second display sub-panel is performed, inputting a first gate scan signal to the first gate line of the first display sub-panel and enabling the display of the first display sub-panel; and the gate scan signal driving the corresponding single-way conducting switch to be unidirectionally turned on from the first gate line to the second gate line of the second display sub-panel, and allowing the simultaneous display of the second display sub-panel and the first display sub-panel.

An embodiment of the present disclosure further provides a display device comprising the above described display panel.

BRIEF DESCRIPTION OF THE DRAWINGS

In order to illustrate the technical resolutions of the embodiments of the disclosure more clearly, a brief introduction may be given hereinafter to the accompany drawings that may be used in the description of the embodiments. Notably, the drawings in the description below are merely for illustrating some embodiments of the present disclosure, and other drawings may be obtained by those skilled in the art according to these drawings without any creative labor.

DETAILED DESCRIPTION

A clear and through description will be given to the technical solution of the present disclosure with reference to the accompanying drawings of the present disclosure. Understandably, the illustrated embodiments are not all of the embodiments of the present disclosure, but only a part of them. According to the embodiments of the present disclosure, all of the other embodiments obtained by those skilled in the art without consuming any creative work fall within the protection scope of the present disclosure.

Figure 1:
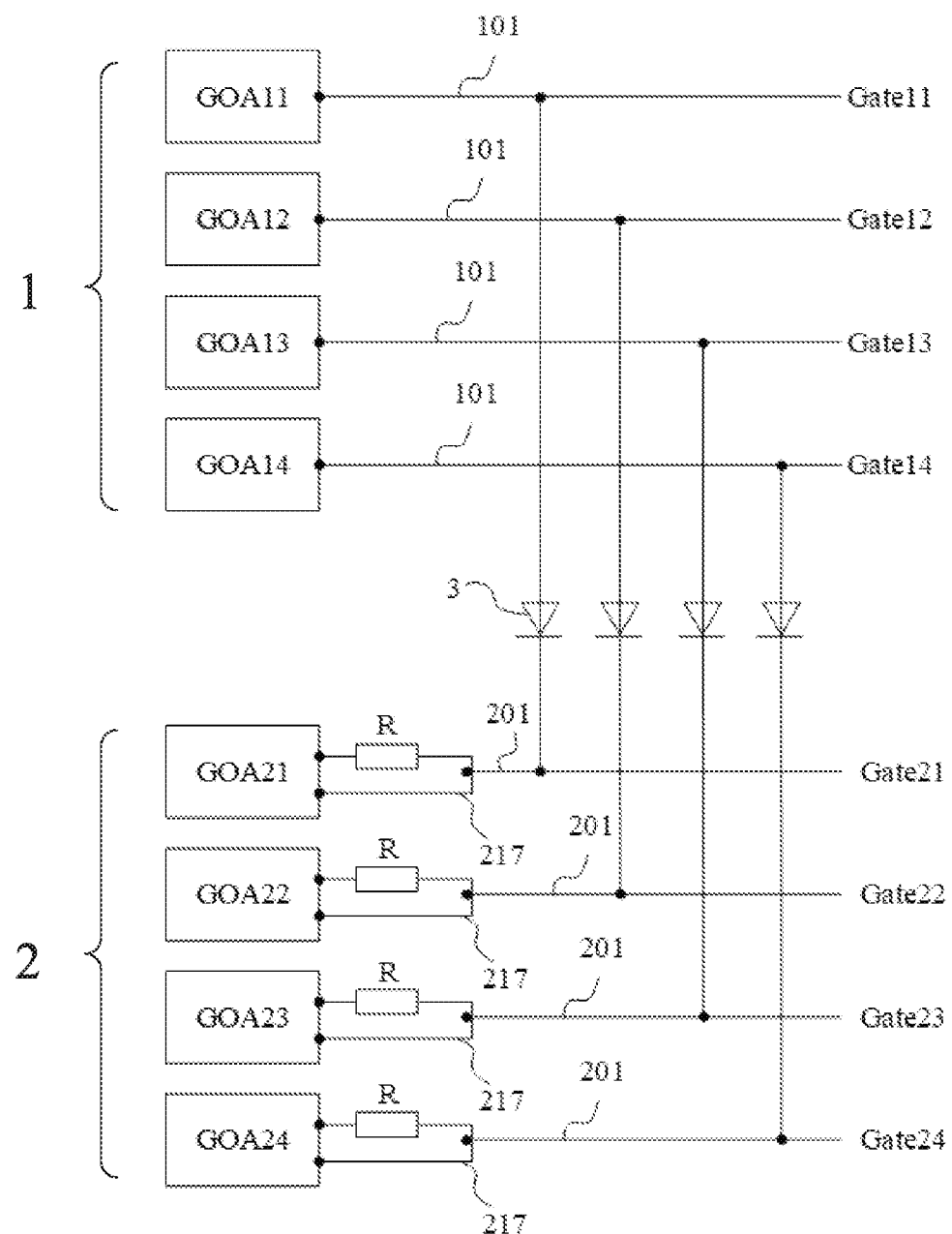
FIG. 1 is a schematic diagram of a circuit of a display panel according to an embodiment of the present disclosure.

Referring to FIG. 1, a display panel in an embodiment of the present disclosure includes a first display sub-panel 1 and a second display sub-panel 2 which are disposed opposite to each other. The first display sub-panel 1 includes a plurality of first gate lines 101 and the second display sub-panel 2 includes a plurality of second gate lines 201. The display panel further includes a plurality of single-way conducting switches 3, each of which is connected to one of the first gate lines 101 and one of the second gate lines 201, respectively. Each of the single-way conducting switches 3 has an input end which is electrically connected to the corresponding first gate line 101 and an output end which is electrically connected to the corresponding second gate line 201. Further, each single-way conducting switch 3 is unidirectionally conducted from the corresponding first gate line 101 to the corresponding second gate line 201.

The display panel provided by the embodiment of the present disclosure disposes the single-way conducting switch 3 which is connected between each of the first gate lines 101 and the second gate line 201 corresponding thereto. When the double-sided synchronous display of the display panel is required, a gate scan signal is sent to the first gate line 101 of the display sub-panel 1, but no signal or a cutoff signal is inputted to the second gate line 201 of the second display sub-panel 2. The single-way conducting switch 3, at this time, is turned on and the second gate line 201 corresponding to the first gate line 101 is also synchronously inputted with the gate scan signal by the connection to the single-way conducting switch 3, which allows the synchronous display of the first display sub-panel 1 and the second display sub-panel 2 and improves the synchronization and consistency of screen when the display sub-panel 1 and the second display sub-panel 2 are simultaneously displayed. It should be noted that the cutoff signal or a cutoff voltage described in the embodiment of the present disclosure is a low level signal such as a grounding signal. The single-way conducting switch 3 is unidirectionally conducted from the input end to the output end thereof in the embodiment of the present disclosure. For example, when the single-way conducting switch 3 is a P-N junction, it is unidirectionally conducted from a P-region 301 (input end) to an N-region 302 (output end) of the P-N junction.

Figure 2:
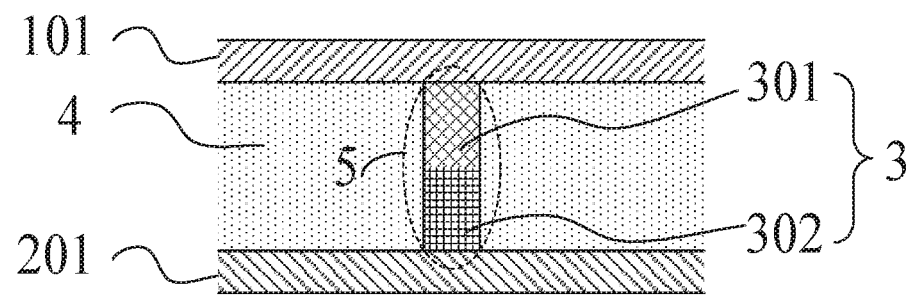
FIG. 2 is a schematic diagram of a through-hole of a wiring area of a display panel according to an embodiment of the present disclosure.

Referring to FIG. 2, the foregoing single-way conducting switch 3 may be a P-N junction in some embodiments, the P-region 301 of which is connected to the first gate line 101 corresponding thereto and the N-region 302 of which is connected to the second gate line 201 corresponding thereto.

Referring to FIG. 2, the display panel further includes a spacer layer 4 interposed between the first display sub-panel 1 and the second display sub-panel 2 in some embodiments. The spacer layer 4 is provided with a plurality of through-holes 5, which correspond to the single-way conducting switches 3 one by one and also correspond to wiring areas of the first display sub-panel 1 and the second display sub-panel 2. It should be noted that the display panel includes a display area and a frame area. The gate lines and data lines in the display area are provided in the frame area through wire bonding, that is to say, the frame area outside the display area is the wiring area in the embodiment of the present disclosure. In addition, it should be noted that FIG. 2 only shows one through-hole 5 in the wiring area and the first gate line 101 as well as the second gate line 201 with which the through-hole 5 is communicating, but it does not show any other structures as provided in the first display sub-panel 1 and the second display sub-panel 2.

Each of the single-way conducting switches 3 can be provided in the through-hole 5 corresponding thereto or in the wiring area of the first display sub-panel 1. By passing through the through-hole 5 corresponding thereto, the output end of each single-way conducting switch 3 is electrically connected to the second gate line 201 corresponding thereto. In this case, a line for the connection of the single-way conducting switch 3 and the second gate line 201 is disposed in the corresponding through-hole 5. When located in the wiring area of the first display sub-panel 1, each of the single-way conducting switches 3 may also be integrated into a gate drive circuit to which each of the first gate lines 101 is connected. In addition, each of the single-way conducting switches 3 can also be located in the wiring area of the second display sub-panel 2. Through the through-hole 5 corresponding thereto, the input end of each of the single-way conducting switches 3 is electrically connected to the first gate line 101 corresponding thereto. In this case, a line for the connection of the single-way conducting switch 3 and the first gate line 101 is disposed in the through-hole 5 corresponding thereto.

The gate drive circuit may be a shift register unit, for example, a GOA unit. Gate Driver on Array (GOA) is a technology for the integration of a gate drive circuit on an array substrate. Pixel units are periodically arranged in the array substrate. Each of the pixel units may include a switch tube and a pixel electrode and each of the pixel electrodes or a light emitting device 8 is driven by connecting a data line and a gate line to the switch tube. The switch tube may be a thin film transistor and have a source electrode to which the data line is connected, as well as a gate electrode to which the gate line is connected and a drain electrode to which the pixel electrode is connected. The GOA unit is used as a shift register unit to drive the switch tube in this embodiment.

When the gate drive circuit is the GOA unit, as shown in FIG. 1, the first display sub-panel 1 further includes a plurality of first GOA units (GOA11~GOA14 in FIG. 1) which are disposed in the wiring areas of the first display sub-panel 1 and the first GOA units are electrically connected to the first gate lines 101 in one-to-one correspondence in some embodiments. In order to more clearly indicate correspondence between the GOA unit and the gate lines, referring to FIG. 1, the first gate line numbered Gate11 corresponds to GOA11, while the first gate line numbered Gate12 corresponds to GOA12, the first gate line numbered Gate13 corresponds to GOA13, and the gate line numbered Gate14 corresponds to GOA14. The second display sub-panel 2 further includes a plurality of second GOA units (GOA21~GOA24 in FIG. 1) which are disposed in the wiring areas of the second display sub-panel 2 and the second GOA units are electrically connected to the second gate lines 201 in one-to-one correspondence. In order to clearly denote correspondence between the GOA unit and the second gate lines, referring to FIG. 1, the second gate line numbered Gate 21 corresponds to GOA21, while the second gate line numbered Gate 22 corresponds to GOA22, the second gate line numbered Gate23 corresponds to GOA23, and the gate line numbered Gate24 corresponds to GOA24. The input end of each of the single-way conducting switches 3 is electrically connected to the first GOA unit and the first gate line 101 corresponding thereto and the output end thereof is electrically connected to the second gate line 201 corresponding thereto.

Each of the first gate lines 101 is connected to a plurality of first switch tubes in a row where the first gate line 101 is arranged, specifically, to a first gate electrode of the first switch tubes. Each of the second gate lines 201 is connected to a second gate electrode of a plurality of second switch tubes in a row where the second gate line 201 is arranged.

Figure 3:
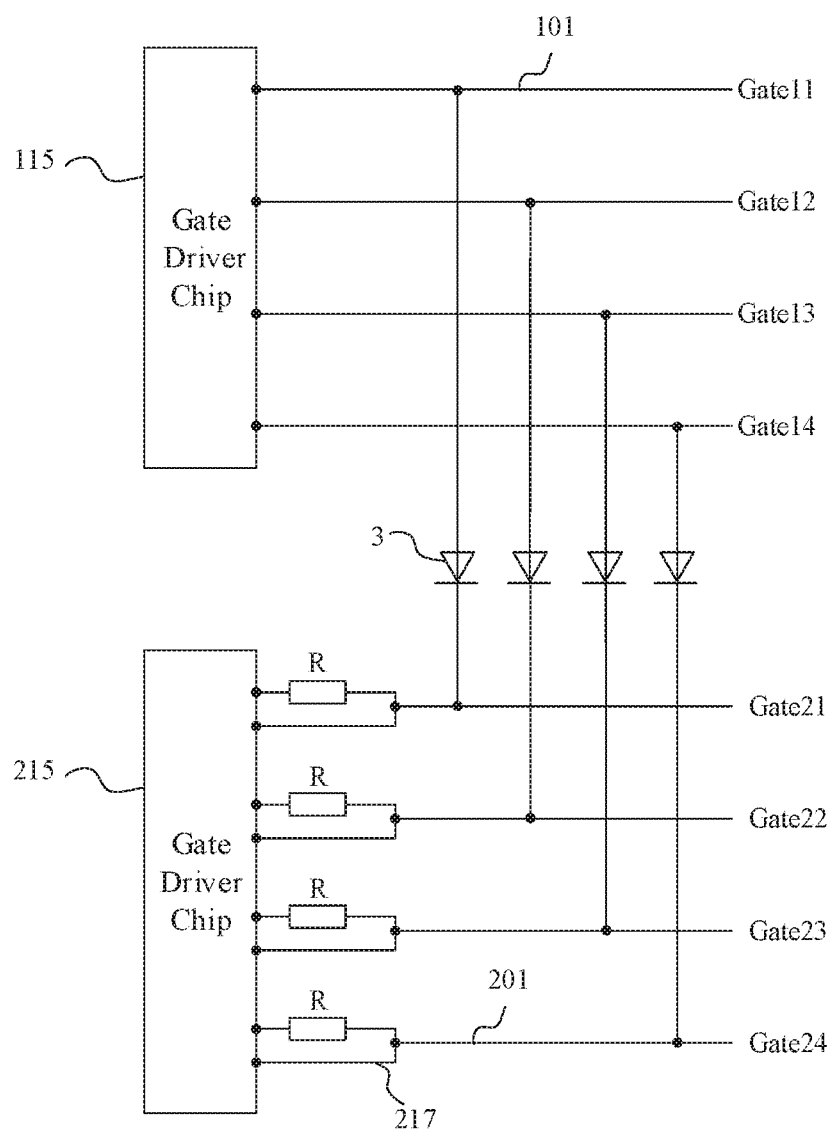
FIG. 3 is a schematic diagram of another circuit of a display panel according to an embodiment of the present disclosure.

The gate drive circuit may also be a gate driver chip, which may be bound to the array substrate and connected to a gate electrode through a gate line. As shown in FIG. 3, a first gate driver chip 115 is used as a driving circuit of a first gate electrode and has a plurality of output ends, each of which is connected to one of the first gate lines 101, respectively. Similarly, a second gate driver chip 215 is used as a driving circuit of a second gate electrode and has a plurality of output ends, each of which is connected to one of the second gate lines 201, respectively. When the gate driver chip is used as the gate drive circuit, as shown in FIG. 3, the single-way conducting switch 3 may be disposed between the first display sub-panel 1 and the second display sub-panel 2 and located in the through-hole 5. Alternatively, the single-way conducting switch 3 may be disposed in the wiring area of the first display sub-panel 1 to be integrated with or separate from the first gate driver chip 115.

It should be noted that only four groups of the first and second gate lines are exemplarily illustrated in FIGS. 1 and 3, however, there are a plurality of groups of the first and gate lines disposed on the wiring area of the display panel in one-to-one correspondence.

The display panel in the embodiment of the present disclosure also has the advantage of reducing power consumption during synchronous display. The synchronous display of the first display sub-panel 1 and the second display sub-panel 2 may be implemented by sending a gate scan signal to the first gate line 101 of the first display sub-panel 1 without any signal input to the second gate line 201 of the second display sub-panel 2. In this case, the first gate driver chip 115 (or each of the first GOA unit) has a signal output but the second gate driver chip 215 (or each of the second GOA units) is in a sleep state, and only the gate drive circuit of the first display sub-panel 1 is operating, thereby reducing the power consumption of the display panel.

As shown in FIGS. 1 and 3, in some embodiments, the second display sub-panel 2 further includes a plurality of voltage stabilizing resistors R which are disposed in the wiring area of the second display sub-panel 2 and a plurality of short-circuit branches 217. The voltage stabilizing resistors R and the single-way conducting switches 3 are in one-to-one correspondence and each of the voltage stabilizing resistors R has one end which is electrically connected to the second GOA unit corresponding thereto and the other end which is electrically connected to the output end of the single-way conducting switch 3 corresponding thereto. The short-circuit branches 217 are disposed in the wiring area of the second display sub-panel 2 and are in one-to-one correspondence to the voltage stabilizing resistors R and each of the short-circuit branches 217 is connected in parallel to both ends of the voltage stabilizing resistor R corresponding thereto. In a specific implementation, two output ends may be provided in the GOA unit, wherein the first output end is connected to the voltage stabilizing resistor R and the second output end is connected to the short-circuit branch 217. Whether or not to output a signal from the first output end is controlled by a circuit and a clock signal within the GOA unit, so as to control the turn-on or turn-off of the voltage stabilizing resistor R, and whether or not to output a signal from the second output end is controlled by a circuit and a clock signal within the GOA unit, so as to control the turn-on or turn-off of the short-circuit branch 217.

For an instance, the GOA units may be a gate drive circuit. When the first display sub-panel 1 and the second display sub-panel 2 are simultaneously displayed, a first gate scan signal is outputted from the first GOA units but no signal or only a cutoff signal is outputted from the second GOA units. The single-way conducting switch 3 corresponding to them, at this time, has a voltage difference between its input end and output end, so the single-way conducting switch 3 is turned on. When there is no voltage stabilizing resistor R provided, since no signal or only a cutoff signal is outputted from the second GOA units, voltage at the output end of the single-way conducting switch 3 is pulled down and voltage of a data signal of each of the second gate electrodes to which the second gate line 201 is connected is pulled down to be lower than a turn-on voltage of the second gate electrode, so that the second gate electrode cannot be turned on. When a voltage stabilizing resistor R is provided, the short-circuit branch 217 is disconnected when the synchronous display is performed so as to keep the conducting of the voltage stabilizing resistor R. A appropriate type of resistor may be selected to maintain voltage inputted to each of the second gate electrodes at an appropriate value, which is neither higher than voltage of the first gate scan signal to unable to conduct the single-way conducting switch nor lower than the turn-on voltage of each of the second gate electrodes, so as to ensure the normal turn-on of each of the second gate electrodes and smoothly realize the double-sided synchronous display.

In some embodiments, the above voltage stabilizing resistors may be directly connected to a grounding signal other than the gate drive circuit. That is to say, one end of each of the voltage stabilizing resistors R is electrically connected to the grounding signal and a switch which controls on and off of the voltage stabilizing resistor R is interposed between the voltage stabilizing resistor R and the grounding signal. The other end of each of the voltage stabilizing resistors R is electrically connected to the output end of the single-way conducting switch 3 corresponding thereto. A plurality of short-circuit branches 217 are disposed in the wiring area of the second display sub-panel 2 and are in one-to-one correspondence to the voltage stabilizing resistors R. Each short-circuit branch 217 has one end which is connected to a second gate drive circuit and the other end which is connected to the second gate line. The on and off of the voltage stabilizing resistor R are controlled by the switch between the voltage stabilizing resistor R and the grounding signal and the on and off of the short-circuit branch is controlled by the second gate drive circuit (the second GOA unit or a second gate starting chip 215). The operation principle of the circuit refers to the operation principle of the circuit shown in FIGS. 1 and 3, and repetitive descriptions will not be elaborated herein.

The above-described voltage stabilizing resistors R may be fixed resistors or variable resistors. In practical applications, a resistance value of the voltage-stabilizing resistors R may be determined by reasonable test and calculation and may be ranged from several ohms to several megaohms. For example, a display panel of a device such as a mobile phone has a resistance of less than 10Ω and a 60-inch TV may have a resistance in the order of magnitude of kiloohm (kΩ), megaohm (MΩ).

Figure 4:
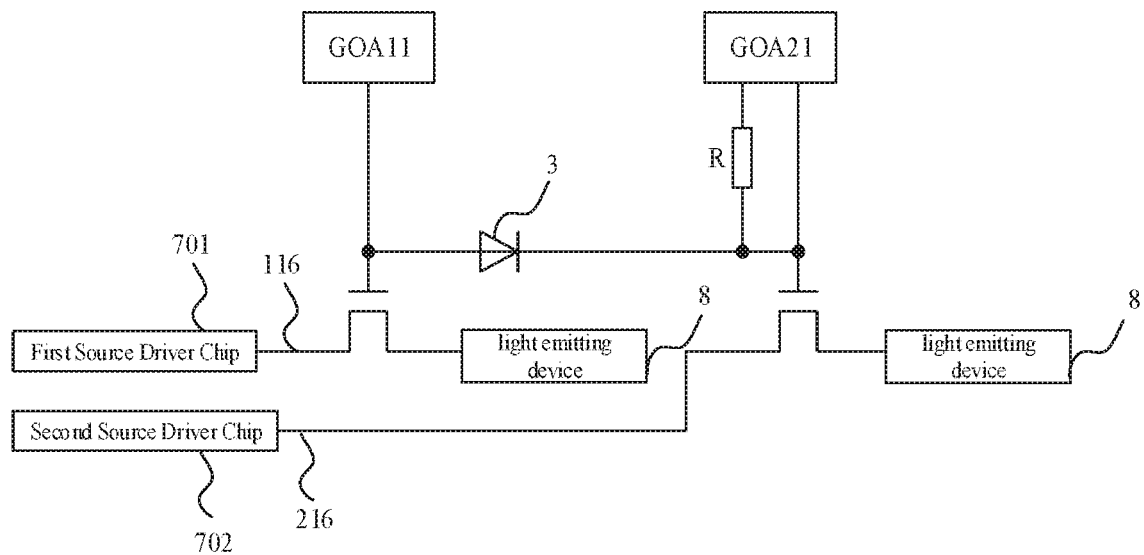
FIG. 4 is a schematic diagram of a circuit with a source driver chip of a display panel according to an embodiment of the present disclosure.

The first display sub-panel 1 further includes a plurality of first data lines 116 and the second display sub-panel 2 further includes a plurality of second data lines 216 in some embodiments. It should be noted that FIGS. 4-5 only show a schematic circuit diagram of a display panel having a source driver chip 7 by taking an example of a group of the first GOA unit and first gate line in the first display sub-panel 1 as well as a group of the second GOA unit and second gate line in the second display sub-panel 2 corresponding thereto. Furthermore, FIGS. 4 and 5 only exemplarily show a first data line 116 and a second data line 216. As shown in FIG. 4, the display panel includes two source driver chips, which are a first source driver chip 701 and a second source driver chip 702 in some embodiments. The first source driver chip 701 is electrically connected to a plurality of first data lines 116 and the second source driver chip 702 is electrically connected to a plurality of second data lines 216. The above-described two source driver chips may input different data signals to the first data lines 116 and the second data lines 216, respectively, so as to realize the simultaneous display of a first display sub-substrate and a second display sub substrate and the displayed images are distinct. The above scheme in which the two source driver chips are disposed may also realize the separate display of a corresponding display sub-panel or the double-sided simultaneous display by cooperation with a gate drive circuit and by one of the source driver chips outputting a cutoff signal to a data line connected thereto.

Figure 5:
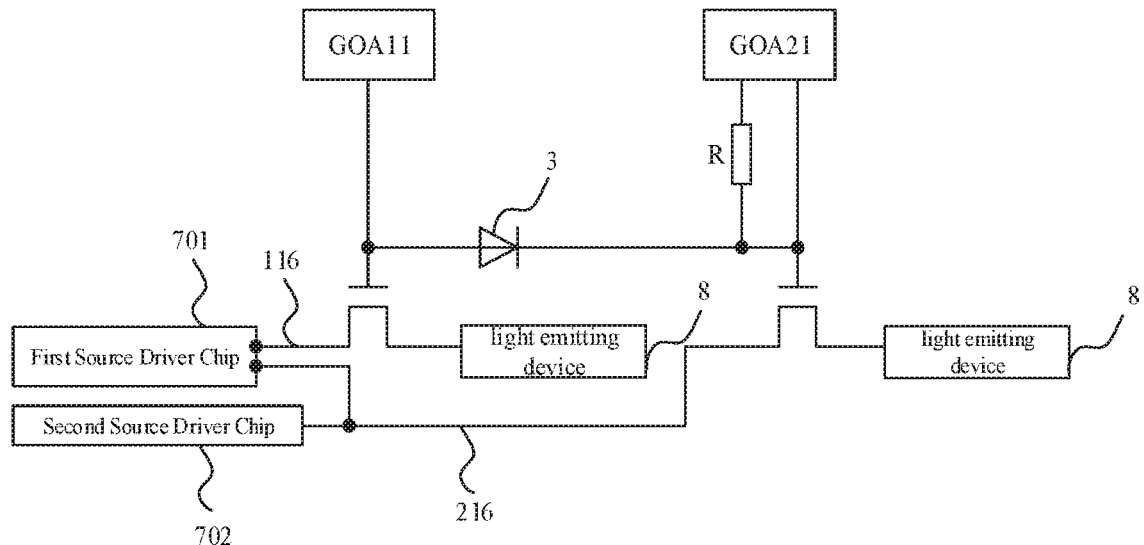
FIG. 5 is a schematic diagram of another circuit with a source driver chip according to an embodiment of the present disclosure.

As shown in FIG. 5, the first source driver chip 701 includes a plurality of first output ends (only one of which is shown in FIG. 5) and a plurality of second output ends (only one of which is shown in FIG. 5) in some embodiments. The first output ends of the first source driver chip 701 are electrically connected to the first data lines 116 in a one-to-one correspondence way and the second output ends of thereof are electrically connected to the second data lines 216 in a one-to-one correspondence way. The second source driver chip 702 is electrically connected to the second data lines 216. When the same contents are synchronously displayed by the first display sub-substrate and the second display sub-substrate, the second source driver chip 702 connected to the second data lines 216 has no signal output, but the first source driver chip 701 simultaneously outputs source drive signals to the first data lines 116 and the second data lines 216, respectively, through the first output ends and the second output ends, which improve the consistency of the signals of the first display sub-panel 1 and the second display sub-panel 2, and further increases the consistency of the simultaneous display of the first display sub-panel 1 and the second display sub-panel 2. In addition, only the first source driver chip 701 is required to be turned on upon the synchronous display, which may save energy consumption.

Figure 6:
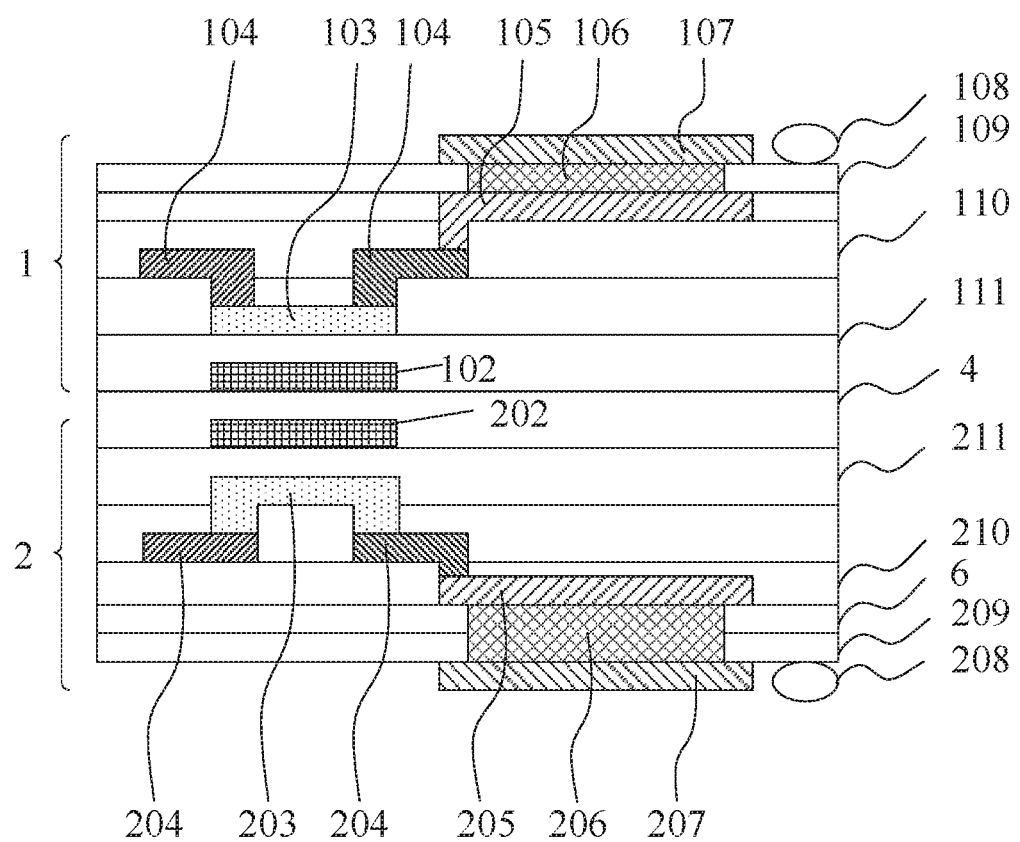
FIG. 6 is a block diagram of a kind of display panel according to an embodiment of the present disclosure.
Figure 7:
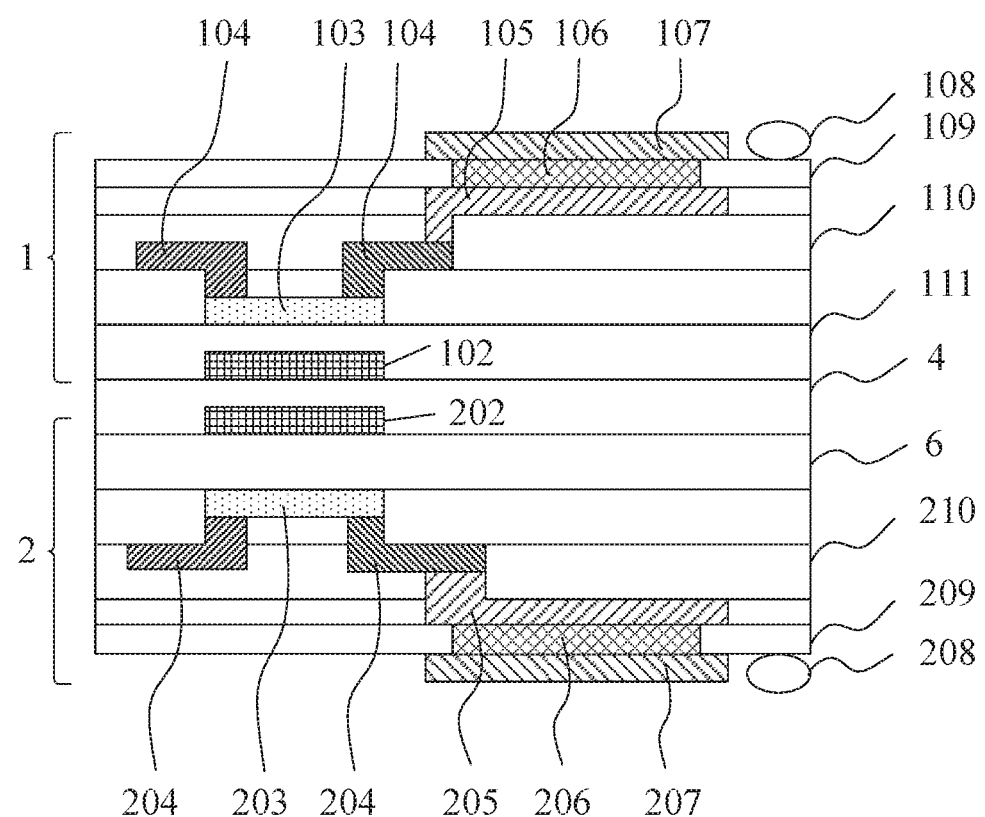
FIG. 7 is a block diagram of another kind of display panel according to an embodiment of the present disclosure.
Figure 8:
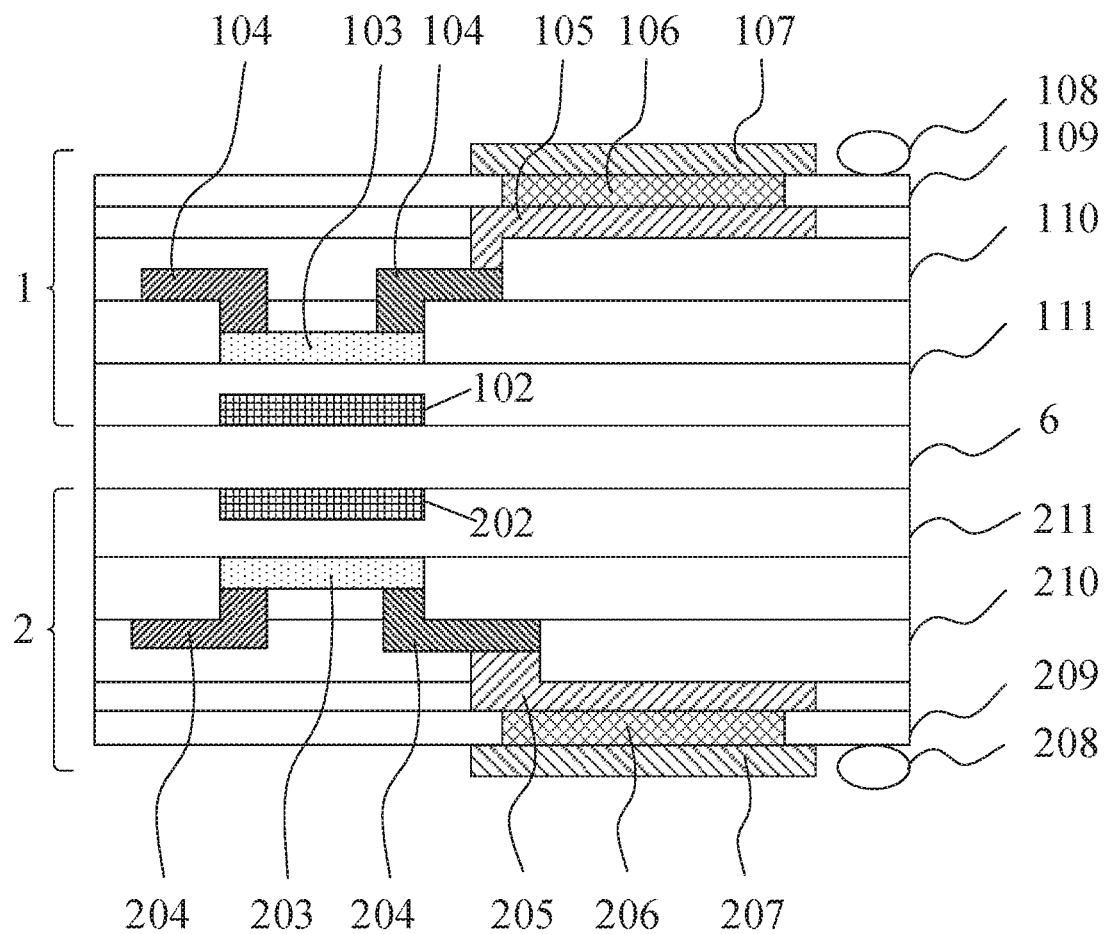
FIG. 8 is a block diagram of another kind of display panel according to an embodiment of the present disclosure.

As shown in the figures, the light emitting device 8 of the display panel may be an OLED (Organic Light Emitting Diode) in some embodiments. As shown in FIGS. 6-8, the first display sub-panel 1 includes a first gate layer 102 which includes a plurality of first gate lines 101, a first active layer 103, a first source and drain layer 104, a first anode layer 105, a first luminescent layer 106, and a first cathode layer 107, in a direction perpendicular to the spacer layer 4 and pointed to the first display sub-panel 1 from the spacer layer 4. The second display sub-panel 2 includes a second gate layer 202 which includes a plurality of second gate lines 201, a second active layer 203, a second source and drain layer 204, a second anode layer 205, a second luminescent layer 206, and a second cathode layer 207, in a direction perpendicular to the spacer layer 4 and directed from the spacer layer 4 to the second display sub-panel 2. The display panel further includes a base substrate 6, as shown in FIG. 6. The base substrate 6 may be located between the second cathode layer 207 and the second anode layer 205. As shown in FIG. 7, the base substrate 6 may be located between the second gate layer 202 and the second active layer 203. As shown in FIG. 8, the base substrate 6 may be located between the first gate layer 102 and the second gate layer 202 and the base substrate 6 serves as the spacer layer 4. The base substrate 6 may also be located between the first cathode layer 107 and the first anode layer 105 or the substrate 6 is located between the first gate layer 102 and the first active layer 103. The above base substrate 6 is used to form various functional layers on both sides thereof, respectively. In this embodiment, only one base substrate 6 needs to be disposed, which contributes to the reducing of a thickness of the whole display panel compared with a conventional double-sided display panel on which two base substrates 6 are disposed.

The above base substrate 6 may be a rigid base substrate 6 made of glass, for example, or a flexible base substrate 6 made of polyethylene naphthalate or polyethylene terephthalate, for example.

In some embodiments, the display panel further includes a first support member 108 disposed on a side of the first cathode layer 107 facing away from the base substrate 6, and a second support member 208 disposed on a side of the second cathode layer 207 facing away from the base substrate 6. The first and second support members 108 and 208 provide support between the display panel and other components (such as a polarizer) disposed on the outside of the display panel.

Figure 9:
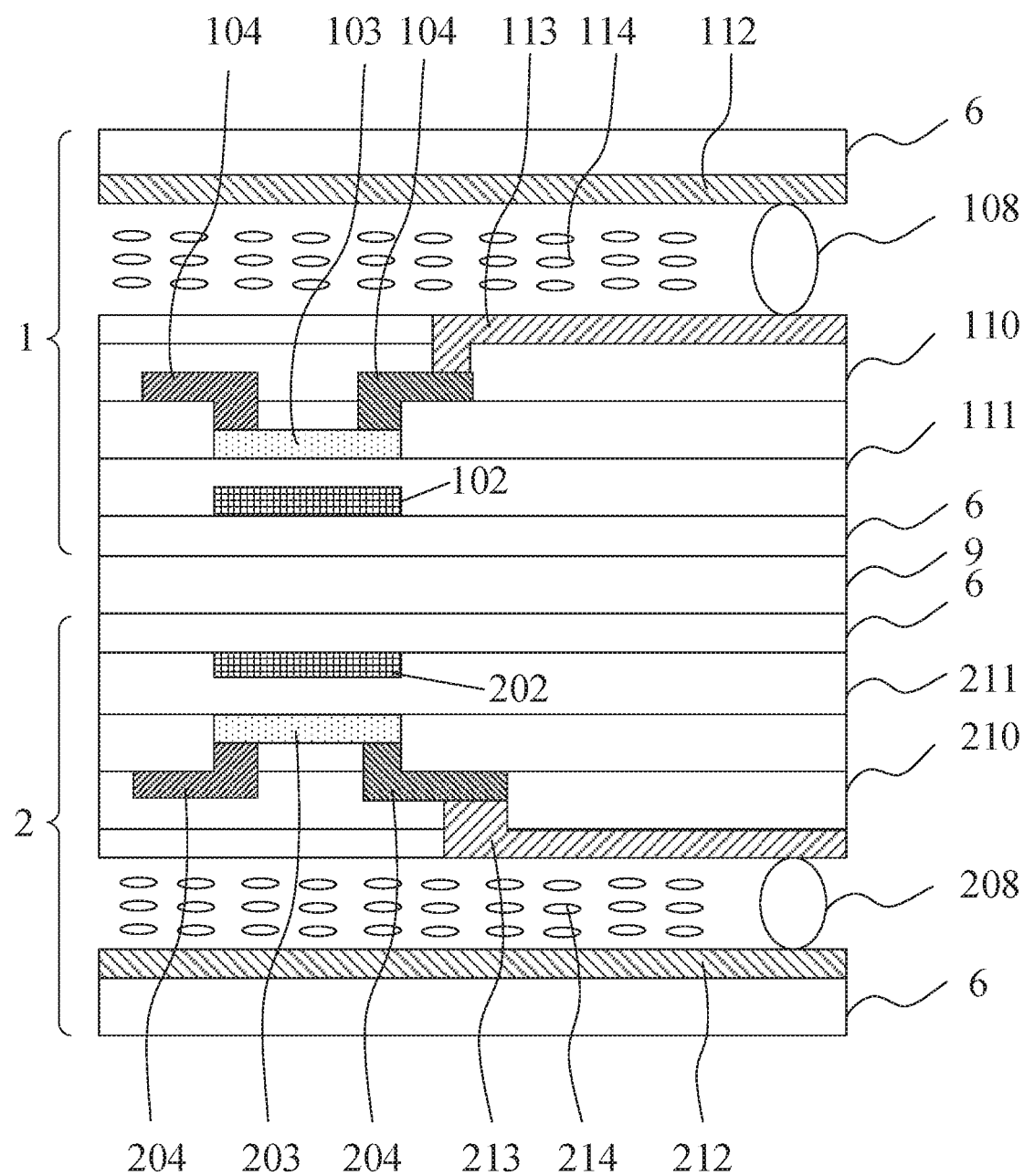
FIG. 9 is a block diagram of another kind of display panel according to an embodiment of the present disclosure.

In some embodiments, the first display sub-panel 1 includes a first liquid crystal cell and the second display sub-panel 2 includes a second liquid crystal cell, as shown in FIG. 9. The display panel further includes a backlight 9 disposed between the first display sub-panel 1 and the second display sub-panels 2 and the backlight 9 can emit light on both sides thereof and can be used as the spacer layer 4. In a direction perpendicular to the backlight 9 and directed from the backlight 9 to the first display sub-panel 1, the first display sub-panel 1 includes a first gate layer 102 which includes a plurality of first gate lines 101, a first source layer 103, a first source and drain layer 104, a layer of a first pixel electrode 113 which is electrically connected to a first drain electrode, a first liquid crystal layer 114, and a layer of a first common electrode 112. In a direction perpendicular to the backlight 9 and directed from the backlight 9 to the second display sub-panel 2, the second display sub-panel 2 includes a second gate layer 202 which includes a plurality of second gate lines 201, a second source layer 203, a second source and drain layer 204, a layer of a second pixel electrode 213 which is electrically connected to a second drain electrode, a second liquid crystal layer 214, and a layer of a second common electrode 212.

An embodiment of the present disclosure further provides a method for manufacturing a display panel which includes the following steps:

In step S1, a base substrate 6 having a first surface and a second surface, which is opposite to the first surface, is provided.

In step S2, a first stacked structure is formed on the first surface.

In step S3, a second stacked structure is formed on the second surface.

The structure consisted of the first stacked structure, the base substrate 6 and the second stacked structure include a first display sub-panel 1 and a second display sub-panel 2 disposed opposite to each other and a plurality of single-way conducting switches 3. The first display sub-panel 1 includes a plurality of first gate lines 101 and the second display sub-panel 2 includes a plurality of second gate lines 201. The first gate lines 101, the second gate lines 201 and the single-way conducting switches 3 are provided in one-to-one correspondence. Each of the single-way conducting switches 3 includes an input end which is electrically connected to the first gate line 101 corresponding thereto and an output end which is electrically connected to the second gate line 201 corresponding thereto. Each of the single-way conducting switches 3 is unidirectionally conducted from the first gate line 101 to the second gate line 201 corresponding thereto.

The method for manufacturing a display panel provided by this embodiment can achieve a beneficial effect the same as that achieved by the above-mentioned display panel, which will not be elaborated herein.

In some embodiments, the step in which the first stacked structure is formed on the first surface includes the following steps.

In step S111, a second anode layer 205, a second source and drain layer 204, a second active layer 203, a second gate layer 202, and a spacer layer 4 are sequentially formed on the first surface in this order.

In step S112, a plurality of through-holes 5 are formed in the spacer layer 4 and the single-way conducting switches 3 are formed in the through-holes 5, and are electrically connected to the second gate layer 202.

In step S113, a first gate layer 102 which is electrically connected to the second gate layer 202 via the single-way conducting switch 3, a first active layer 103, a first source and drain layer 104, a first anode layer 105, a first luminescent layer 106, and a first cathode layer 107 are sequentially formed on a side of the through-hole 5 facing away from the base substrate 6.

The step in which the second stacked structure is formed on the second surface includes:

In step S211, a plurality of openings, in which a second luminescent layer 206 is formed, are formed on the base substrate 6.

In step S212, a second cathode layer 207 is formed on a surface of the second luminescent layer 206 facing away from the base substrate 6.

During the forming of the above functional layers, an insulating layer or a passivation layer is also formed between them to perform the insulation and protection of the functional layers. In specific implementation, referring to FIG. 6, during the forming of the first stacked structure on the first surface of the base substrate 6, first, the second anode layer 205 is formed on the first surface. Subsequet to the forming of a desired pattern of the second anode layer 205 by an etching process or the like. A second passivation layer 210 is formed on the second anode layer 205 and a via-hole is formed at a position corresponding to the second anode layer 205 in the second passivation layer 210. The second source and drain layer 204 is further formed on the second passivation layer 210 and the second drain electrode is connected to the second anode layer 205 through the via-hole. Subsequent to the obtaining of the desired pattern of the second source and drain layer 204 by etching or the like, an insulating layer is formed on the second source and drain layer 204, and a via-hole is formed at a position corresponding to the pattern of the second source and drain layer 204 in the insulating layer. The second active layer 203 is formed on the insulating layer and the second active layer 203 is connected to a second source electrode and the second drain electrode through the via-hole in the insulating layer. A second insulating layer 211 is formed on the second active layer 204 and the second gate layer 202 is then formed on the second insulating layer 211. The spacer layer is formed on the second gate layer 202 subsequent to the forming of the desired pattern of the second gate layer 202. The through-holes 5 are formed in the spacer layer 4 and the single-way conducting switches 3 are formed in the through-holes 5 and are electrically connected to the second gate layer 202. The first gate layer 102 is formed on a side of the through-hole 5 facing away from the base substrate 6 and a first insulating layer 111 is then formed on the first gate layer 102. Thereafter, the first active layer 103 and an insulating layer are sequentially formed on the first insulating layer 111 and a via-hole is formed in the insulating layer. The first source and drain layer 104 is formed on the insulating layer and a first source electrode is connected to the first active layer 103 through the via-hole while a first drain electrode is connected to the first active layer 103 through another via-hole. A first passivation layer 110 is formed on the first source and drain layer 104 and a via-hole is formed at a location corresponding to the first drain electrode in the first passivation layer 110. The first anode layer 105 is formed on the first passivation layer 110 and is connected to the first drain electrode through the via-hole. After a desired pattern for the first anode layer 105 is formed by processes such as exposure and etching, an insulating layer is formed on the first anode layer 105 and an opening is formed at a location corresponding to a first anode in the insulating layer. Thereafter, a first pixel defining layer 109 is formed over the insulating layer and an opening, in which the first luminescent layer 106 is formed, is formed at a position corresponding to the first anode in the first pixel defining layer 109. Finally, the first cathode layer 107 is formed on the first luminescent layer 106.

The fabricated first surface of the base substrate 6 is flipped down to allow the second surface of the base substrate 6 to face upward. During the forming of the second stacked structure on the second surface of the base substrate 6, a plurality of openings are first formed on the base substrate 6 and a second pixel defining layer 209 is formed on the second surface of the base substrate 6 and openings are also formed at positions corresponding to the openings of the base substrate 6 in the second pixel defining layer 209 and a second luminescent layer 206 is formed in the openings of the base substrate 6 and the second pixel defining layer 209. Finally, the second cathode layer 207 is formed on a surface of the second luminescent layer 206 facing away from the base substrate 6.

Referring to FIG. 7, in some embodiments, the step in which the first stacked structure is formed on the first surface includes the following steps.

In step S121, a second gate layer 202 and a spacer layer 4 are sequentially formed on the first surface.

In step S122, a plurality of through-holes 5 are formed in the spacer layer 4 and a plurality of single-way conducting switches 3 are formed in the through-holes 5 and are electrically connected to the second gate layer 202.

In step S123, a first gate layer 102, a first active layer 103, a first source and drain layer 104, a first anode layer 105, a first luminescent layer 106, and a first cathode layer 107 are sequentially formed on a side of the through-holes 5 facing away from the base substrate 6, wherein the first gate layer 102 is electrically connected to the second gate layer 202 through the single-way conducting switch 3.

The step in which the second stacked structure is formed on the second surface includes the following steps.

In step S221, a second active layer 203, a second source and drain layer 204, a second anode layer 205, a second luminescent layer 206, and a second cathode layer 207 are sequentially formed on the second surface.

In the steps above, a plurality of insulating layers or passivation layers are also formed during the forming of the functional layers and a principle for the forming of the layers refers to the description of the forming of the layers in the embodiment shown in FIG. 6.

Referring to FIG. 8, in some embodiments, the step of forming the first stacked structure on the first surface includes the following steps.

In step S131, a plurality of through-holes 5 are formed in the base substrate 6 and a plurality of single-way conducting switches 3 are formed in the through-holes 5.

In step S132, a first gate layer 102, a first active layer 103, a first source and drain layer 104, a first anode layer 105, a first luminescent layer 106, and a first cathode layer 107 are sequentially formed on the first surface, wherein the first gate layer 102 is electrically connected to the single-way conducting switches 3.

The step of forming the second stacked structure on the second surface includes the following steps.

In step S231, a second gate layer 202, a second active layer 203, a second source and drain layer 204, a second anode layer 205, a second luminescent layer 206 and a second cathode layer 207 are sequentially formed on the second surface, wherein the second gate layer 202 is electrically connected to the single-way conducting switches 3.

An embodiment of the present disclosure further provides a method for driving a display panel, which is used for driving the display panel as described above. The driving method includes: when a first display sub-panel 1 and a second display sub-panel 2 are simultaneously displayed, inputting a first gate scan signal to a first gate line 101 of the first display sub-panel 1 and enabling the display of the first display sub-panel 1; and the first gate scan signal driving a corresponding single-way conducting switch 3 to be unidirectionally turned on from the first gate line 101 to a second gate line 201 of the second display sub-panel 2, and allowing the simultaneous display of the second display sub-panel 2 and the first display sub-panel 1. The method for driving a display panel provided by this embodiment can achieve a beneficial effect the same as that achieved by the above-mentioned display panel, which will not be elaborated herein.

Hereinafter, the driving method for the display panel will be described in detail by taking an example in which the gate drive circuit is a GOA unit. The technical solution of the gate drive circuit serving as a gate driver chip is also included in the protection scope of the present disclosure.

In specific implementation, a first GOA unit provides a first gate scan signal to a first gate line 101 while a second GOA unit outputs no signal or a cutoff signal to a second gate line 201, so that a single-way conducting switch 3 has a voltage difference between both ends thereof and the single-way conducting switch 3 is unidirectionally conducted from the first gate line 101 to the second gate line 201 of the second display sub-panel 2, so as to synchronize the input of the first gate scan signal to the second gate line 201 with that to the first gate line 101 and achieve the simultaneous display of the first display sub-panel 1 and the second display sub-panel 2.

In order to better ensure the stabilization of a signal pressure of second gate electrodes connected to the second gate lines 201 during the synchronous display, in some embodiments, the second display sub-panel 2 further includes a plurality of voltage stabilizing resistors R which are disposed in a wiring area of the second display sub-panel 2, as shown in FIG. 1. The voltage stabilizing resistors R and the single-way conducting switches 3 are disposed in one-to-one correspondence and each of the voltage stabilizing resistors R has one end which is electrically connected to the second GOA unit corresponding thereto and the other end which is electrically connected to the output end of the single-way conducting switch 3 corresponding thereto. When the simultaneous display of the first display sub-panel 1 and the second display sub-panel 2 is performed, a first gate scan signal is input to the first gate lines 101 of the first display sub-panel 1, to enable the display of the first display sub-panel 1. The voltage stabilizing resistors R are conducted and the first gate scan signal drives the single-way conducting switch 3 corresponding thereto to be unidirectionally conducted from the first gate line 101 to the second gate line 201 of the second display sub-panel 2, so as to achieve the synchronous display of the second display sub-panel and the first display sub-panel. That is to say, a first gate scan signal is outputted from the first GOA units, but no signal or only a cutoff signal is outputted from the second GOA units. The single-way conducting switch 3 corresponding to them, at this time, has a voltage difference between its input end and output end, so the single-way conducting switch 3 is turned on. When there is no voltage stabilizing resistor R provided, since no signal or only a cutoff signal is outputted from the second GOA units, voltage at the output end of the single-way conducting switch 3 is pulled down and voltage of each of the second gate electrodes to which the second gate line 201 is connected is pulled down to be lower than a turn-on voltage of the second gate electrode, so that the second gate electrode cannot be turned on. When a voltage stabilizing resistor R is provided, the voltage stabilizing resistor R remains conducted when the synchronous display is performed. A appropriate type of resistor may be selected to maintain voltage inputted to each of the second gate electrodes at an appropriate value, which is neither higher than voltage of the first gate scan signal to unable to conduct the single-way conducting switch nor lower than the turn-on voltage of each of the second gate electrodes, so as to ensure the normal turn-on of each of the second gate electrodes and smoothly realize the double-sided synchronous display.

In some embodiments, the driving method further includes: when the first display sub-panel 1 and the second display sub-panel 2 display different screens, inputting a first gate scan signal $V_1$ to the first gate line 101 of the first display sub-panel 1 to realize the display of a first screen of the first display sub-panel 1; inputting a second gate scan signal $V_2$ to the second gate line 201 of the second display sub-panel 2 and $V_1-V_2<V_{on}$, wherein $V_{on}$ is a forward turn-on voltage of the single-way conducting switch 3 and the second display sub-panel 2 displays a second screen. In specific implementation, the first gate scan signal $V_1$ may be input to the first gate lines 101 by the first GOA units in a one-to-one correspondence way while the second gate scan signal $V_2$ may be input to the second gate lines 201 by the second GOA units in a one-to-one correspondence way. When $V_1-V_2<V_{on}$, the single-way conducting switch 3 cannot be reversely conducted, the first gate electrodes connected to the first gate lines 101 are turned on and the second gate electrodes connected to the second gate lines 201 are turned on. A first data signal is input to first data lines 116 through a first source starting chip in the first display sub-panel 1 and a second data signal is input to second data lines 216 through a second source starting chip in the second display sub-panel 2, so as to realize the simultaneous display of the two display sub-panels to display different screens.

In some embodiments, the driving method for the display panel further includes: when the first display sub-panel 1 displays a screen but the second display sub-panel 2 displays no screen, inputting a first gate scan signal to the first gate line 101 of the first display sub-panel 1 to allow the first display sub-panel 1 to display a first screen; and inputting a cutoff signal to the second gate line 201 of the second display sub-panel 2 to pull down a signal on the second gate line 201 and, thus, the second display sub-panel 2 does not display any screen. In a specific implementation, the display panel further includes a plurality of short-circuit branches 217 disposed in the wiring area of the second display sub-panel 2. The short-circuit branches 217 are disposed in one-to-one correspondence to the voltage stabilizing resistors R and each of the short-circuit branches 217 is connected in parallel to both ends of the voltage stabilizing resistor R corresponding thereto. The second display sub-panel 2 further includes a plurality of second data lines 216. Two output ends are disposed in the second GOA unit, wherein the first output end is connected to the voltage stabilizing resistor R and the second output end is connected to the short-circuit branch 217. On or off of the first output end and the second output end is controlled by a circuit and a clock signal within the second GOA unit, so as to control turn-on or turn-off of the voltage stabilizing resistor R and the short-circuit branch 217. When the short-circuit branch 217 is conducted, the voltage stabilizing resistor R is short-circuited and since the second GOA unit has no signal output or only outputs a cutoff signal, voltage at the output end of the single-way conducting switch 3 is pulled down, so that voltage of the second gate electrodes connected to the second gate lines 201 is pulled down. When the voltage is lower than the turn-on voltage of the second gate electrodes, the second gate electrodes cannot be turned on, so that the second display sub-panel 2 fails to display a screen, but the first GOA unit normally inputs a first gate drive signal to the first gate lines 101, to allow the normal display of a screen of the first display sub-panel 1.

It should be noted that in an embodiment in which a short-circuit branch 217 are provided, upon the simultaneous display of the first display sub-panel 1 and the second display sub-panel 2, the voltage stabilizing resistor R is conducted but the short-circuit branch 217 is disconnected so as to ensure the normal operation of the voltage stabilizing resistor R.

When the first display sub-panel 1 displays a screen but the second display sub-panel 2 does not display any screen, a first gate scan signal may be input to the first gate line 101 of the first display sub-panel 1 to enable the display of a first screen of the first display sub-panel 1, however, the second data line 216 of the second display sub-panel 2 has no signal input thus the second display sub-panel 2 fails to display any screen. That is to say, the first GOA unit supplies a first gate scan signal to the first gate line 101 and the first source driver chip 701 supplies a first data signal to the first source electrode connected to the first data line 116, to realize the display of the first display sub-panel 1. The second GOA unit supplies a second gate scan signal to the second gate line 201 and the second source driver chip 702 does not supply any data signal to the second source electrode connected to the second data line 216, so the display of the second display sub-panel 2 is not performed.

In some embodiments, the driving method further includes: when the first display sub-panel 1 does not display any screen, but the second display sub-panel 2 displays a screen, inputting no signal or a cutoff signal $V_3$ to the first gate line 101 of the first display sub-panel 1; inputting a second gate scan signal $V_2$ to the second gate line 201 of the second display sub-panel 2, wherein a difference of $V_2-V_3$ is less than a reverse breakdown voltage of the single-way conducting switch 3, so the display of the second display sub-panel 2 is performed. That is to say, the first GOA unit outputs no signal or a cutoff signal $V_3$ to the first gate line 101 corresponding thereto, but the second GOA unit outputs a second gate scan signal $V_2$ to the second gate line 201 corresponding thereto. The single-way conducting switch 3 corresponding to the second gate line 201, at this time, is not conducted, and the difference of $V_2-V_3$ is smaller than the reverse breakdown voltage of the single-way conducting switch 3, so the display of a screen of the second display sub-panel 2 is performed, but the display of a screen of the first display sub-panel 1 is not performed.

An embodiment of the present disclosure also provides a display device including the display panel as described above. The display device may be an OLED display device, a liquid crystal display device, a PM-OLED (Passive Matrix Organic Light Emitting Diode) display device, an AM-OLED (Active Matrix Organic Light Emitting Diode) display device, a Micro-OLED (Organic Light Emitting Diode Microdisplay Technology) display device, a QLED (Quantum Dot Light Emitting Diodes) display device, and the like. During specific implementation, the display device may be products or components having a display function such as mobile phones, tablets, televisions, monitors, notebook computers, digital photo frames, and navigators which perform a double-sided display.

The display device provided by the embodiment of the present disclosure can achieve a beneficial effect the same as that achieved by the above-mentioned display panel, which will not be elaborated herein.

The above-described contents are only specific embodiments of the present disclosure and the protection scope of the present disclosure is not limited thereto. Any person skilled in the art can easily think of changes or substitutions that fall into the protection scope of the present disclosure within the technical scope of the disclosure of the present disclosure. Therefore, the protection scope of the present disclosure should be determined by the protection scope of the claims.

What is claimed is:
1. A system, comprising:
 a display panel, comprising:
  a first display sub-panel and a second display sub-panel disposed opposite to each other, the first display sub-panel comprising a plurality of first gate lines and the second display sub-panel comprising a plurality of second gate lines;
  a plurality of single-way conducting switches, one correspondence one of the plurality of first gate lines, one of the plurality of second gate lines, and one of the plurality of single-way conducting switches being connected and disposed in a one-to-one correspondence; and
  wherein one of the single-way conducting switches has an input end electrically connected to the corre- sponding first gate line and an output end electrically connected to the corresponding second gate line, and one of the single-way conducting switches is unidirectionally conducted from the corresponding first gate line to the corresponding second gate line.

2. The system according to claim 1, wherein the single-way conducting switch comprises a P-N junction, the P-N junction comprises a P-region connected to the corresponding first gate line and an N-region connected to the corresponding second gate line.

3. The system according to claim 1, wherein the display panel further comprises a spacer layer disposed between the first display sub-panel and the second display sub-panel, the spacer layer being provided with a plurality of through-holes, wherein the through-holes correspond to the single-way conducting switches one by one and correspond to wiring areas of the first display sub-panel and the second display sub-panel;
one of the single-way conducting switches is located in a corresponding through-hole; or
the single-way conducting switches are located in the wiring area of the first display sub-panel, and the output end of each of the single-way conducting switches is electrically connected to the corresponding second gate line through the corresponding through-hole; or
the single-way conducting switches are located in the wiring area of the second display sub-panel, and the input end of each of the single-way conducting switches is electrically connected to the corresponding first gate line through the corresponding through-hole.

4. The system according to claim 3, wherein the first display sub-panel further comprises a plurality of first Gate Driver on Array (GOA) units disposed in the wiring area of the first display sub-panel, the first GOA units being electrically connected to the first gate lines in a one-to-one correspondence way;
the second display sub-panel further comprises a plurality of second GOA units disposed in the wiring area of the second display sub-panel, the second GOA units being electrically connected to the second gate lines in a one-to-one correspondence way; and
the input end of each of the single-way conducting switches being electrically connected to a corresponding first GOA unit and first gate line and the output end of each of the single-way conducting switches being electrically connected to the corresponding second gate line.

5. The system according to claim 4, wherein:
the second display sub-panel further comprises a plurality of voltage stabilizing resistors disposed in the wiring area of the second display sub-panel, the voltage stabilizing resistors and the single-way conducting switches being disposed in one-to-one correspondence;
one of the voltage stabilizing resistors has one end electrically connected to a corresponding second GOA unit and another end electrically connected to the output end of the corresponding single-way conducting switch; and
a plurality of short-circuit branches disposed in the wiring area of the second display sub-panel, the short-circuit branches being disposed in one-to-one correspondence to the voltage stabilizing resistors and one of the short-circuit branches being connected in parallel to both ends of the corresponding voltage stabilizing resistor.

6. The system according to claim 3, wherein:
in a direction perpendicular to the spacer layer and directed to the first display sub-panel from the spacer layer, the first display sub-panel comprises a first gate layer which comprises the first gate lines, a first active layer, a first source and drain layer, a first anode layer, a first luminescent layer and a first cathode layer;
in a direction perpendicular to the spacer layer and directed from the spacer layer to the second display sub-panel, the second display sub-panel comprises a second gate layer which comprises the second gate lines, a second active layer, a second source and drain layer, a second anode layer, a second luminescent layer and a second cathode layer;
the display panel further comprises a base substrate, wherein the base substrate is located between the second cathode layer and the second anode layer; or,
the base substrate is located between the second gate layer and the second active layer; or,
the base substrate is located between the first gate layer and the second gate layer and the base substrate serves as the spacer layer; or,
the base substrate is located between the first cathode layer and the first anode layer; or,
the base substrate is located between the first gate layer and the first active layer.

7. The system according to claim 3, wherein the first display sub-panel comprises a first liquid crystal cell and the second display sub-panel comprises a second liquid crystal cell; and
the display panel further comprises a backlight disposed between the first display sub-panel and the second display sub-panels and the backlight is capable of emitting light on both sides thereof and is used as the spacer layer.

8. The display panel according to claim 1, wherein:
the first display sub-panel further comprises a plurality of first data lines and the second display sub-pane further comprises a plurality of second data lines;
the display panel further comprises a first source driver chip and a second source driver chip, the first source driver chip being electrically connected to the first data lines and the second source driver chip being electrically connected to the second data lines; and
the first source driver chip comprising a plurality of first output ends and a plurality of second output ends, the first output ends of the first source driver chip being electrically connected to the first data lines in a one-to-one correspondence way and the second output ends of the first source driver chip being electrically connected to the second data lines in a one-to-one correspondence way; the second source driver chip being electrically connected to the second data lines.

9. A method for manufacturing a display panel, comprising:
providing a base substrate having a first surface and a second surface, which is opposite to the first surface;
forming a first stacked structure on the first surface;
forming a second stacked structure on the second surface, wherein a structure consisted of the first stacked structure, the base substrate and the second stacked structure comprises a first display sub-panel and a second display sub-panel disposed opposite to each other and a plurality of single-way conducting switches, wherein:
the first display sub-panel comprises a plurality of first gate lines and the second display sub-panel comprises a plurality of second gate lines;

one of the plurality of first gate lines, one of the plurality of second gate lines, and one of the plurality of single-way conducting switches are connected and disposed in a one-to-one correspondence;

one of the single-way conducting switches comprises an input end which is electrically connected to the corresponding first gate line and an output end which is electrically connected to the corresponding second gate line; and one of the single-way conducting switches is unidirectionally conducted from the first gate line to the second gate line corresponding thereto.

10. The method for manufacturing a display panel according to claim 9, wherein the forming a first stacked structure on the first surface comprises:

sequentially forming a second anode layer, a second source and drain layer, a second active layer, a second gate layer and a spacer layer on the first surface;

forming a plurality of through-holes in the spacer layer and forming the single-way conducting switches in the through-holes, the single-way conducting switches being electrically connected to the second gate layer;

sequentially forming a first gate layer, a first active layer, a first source and drain layer, a first anode layer, a first luminescent layer and a first cathode layer on a side of the through-hole facing away from the base substrate, the first gate layer being electrically connected to the second gate layer via the single-way conducting switch; and the step of forming the second stacked structure on the second surface comprises:

forming a plurality of openings on the base substrate and forming a second luminescent layer in the openings;

forming a second cathode layer on a surface of the second luminescent layer facing away from the base substrate.

11. The method for manufacturing a display panel according to claim 9, wherein the forming a first stacked structure on the first surface comprises:

sequentially forming a second gate layer and a spacer layer on the first surface;

forming a plurality of through-holes in the spacer layer and forming the single-way conducting switches in the through-holes, the single-way conducting switches being electrically connected to the second gate layer;

sequentially forming a first gate layer, a first active layer, a first source and drain layer, a first anode layer, a first luminescent layer and a first cathode layer on a side of the through-holes facing away from the base substrate, the first gate layer being electrically connected to the second gate layer through the single-way conducting switch; and the step of forming the second stacked structure on the second surface comprises: sequentially forming a second active layer, a second source and drain layer, a second anode layer, a second luminescent layer and a second cathode layer on the second surface.

12. The method for manufacturing a display panel according to claim 9, wherein the forming a first stacked structure on the first surface comprises:

forming a plurality of through-holes in the base substrate and forming the single-way conducting switches in the through-holes;

sequentially forming a first gate layer, a first active layer, a first source and drain layer, a first anode layer, a first luminescent layer and a first cathode layer on the first surface, the first gate layer being electrically connected to the single-way conducting switches; and the step of forming the second stacked structure on the second surface comprises: sequentially forming a second gate layer, a second active layer, a second source and drain layer, a second anode layer, a second luminescent layer and a second cathode layer on the second surface, the second gate layer being electrically connected to the single-way conducting switches.

13. A driving method for driving a display panel, comprising:

providing the display panel, the display panel comprising:

a first display sub-panel and a second display sub-panel disposed opposite to each other, the first display sub-panel comprising a plurality of first gate lines and the second display sub-panel comprising a plurality of second gate lines; and a plurality of single-way conducting switches, one of the plurality of first gate lines, one of the plurality of second gate lines, and one of the plurality of single-way conducting switches being connected and disposed in a one-to-one correspondence, wherein one of the single-way conducting switches has an input end electrically connected to the corresponding first gate line and an output end electrically connected to the corresponding second gate line, and one of the single-way conducting switches is unidirectionally conducted from the corresponding first gate line to the corresponding second gate line;

when the simultaneous display of the first display sub-panel and the second display sub-panel is performed, inputting a first gate scan signal to the first gate line of the first display sub-panel and enabling the display of the first display sub-panel; and driving, by the first gate scan signal, the corresponding single-way conducting switch to be unidirectionally turned on from the first gate line to the second gate line of the second display sub-panel, and allowing the simultaneous display of the second display sub-panel and the first display sub-panel.

14. The driving method according to claim 13, wherein the second display sub-panel comprises a plurality of voltage stabilizing resistors which are disposed in the wiring area of the second display sub-panel, the voltage stabilizing resistors and the single-way conducting switches being in one-to-one correspondence and one of the voltage stabilizing resistors having one end which is electrically connected to the corresponding second GOA unit and the other end which is electrically connected to the output end of the corresponding single-way conducting switch; and wherein the driving method further comprises:

when the simultaneous display of the first display sub-panel and the second display sub-panel is performed, inputting a first gate scan signal to the first gate line of the first display sub-panel and enabling the display of the first display sub-panel; and conducting the voltage stabilizing resistor and the first gate scan signal driving the corresponding single-way conducting switch to be unidirectionally conducted from the first gate line to the second gate line of the second display sub-panel, and allowing the simultaneous display of the second display sub-panel and the first display sub-panel.

15. The driving method according to claim 13, further comprising:

when the first display sub-panel and the second display sub-panel display different screens, inputting a first gate scan signal $V_1$ to the first gate line of the first display sub-panel to realize the display of a first screen of the first display sub-panel; and inputting a second gate scan signal $V_2$ to the second gate line of the second display sub-panel and $V_1-V_2<V_{on}$, wherein $V_{on}$ is a forward turn-on voltage of the single-way conducting switch and the second display sub-panel displays a second screen.

16. The driving method according to claim 13, further comprising:

when the first display sub-panel displays a screen but the second display sub-panel displays no screen, inputting a first gate scan signal to the first gate line of the first display sub-panel to allow the first display sub-panel to display a first screen;

inputting a cut-off signal to the second gate line of the second display sub-panel to pull down a signal on the second gate line and thus the second display sub-panel does not display any screen; or, inputting a first gate scan signal to the first gate line of the first display sub-panel to allow the first display sub-panel to display a first screen; inputting no data signal to the second display sub-panel so the second display sub-panel does not display any screen.

17. The driving method according to claim 13, further comprising:

when the first display sub-panel does not display any screen, but the second display sub-panel displays a screen, inputting no signal or a cut-off signal $V_3$ to the first gate line of the first display sub-panel; and inputting a second gate scan signal $V_2$ to the second gate line of the second display sub-panel, wherein a difference of $V_2-V_3$ is less than a reverse breakdown voltage of the single-way conducting switch, so the display of the second display sub-panel is performed but the display of the first display sub-panel is not performed.

18. The system according to claim 1, further comprising a display device, the display device comprising the display panel.

19. The system according to claim 2, further comprising a display device, the display device comprising the display panel.

20. The system according to claim 3, further comprising a display device, the display device comprising the display panel.

* * * * *